(12) United States Patent
Ferguson et al.

(10) Patent No.: US 11,249,122 B2
(45) Date of Patent: Feb. 15, 2022

(54) METHOD AND APPARATUS FOR PROVIDING AUTOMATED POWER TOPOLOGY MAPPING

(71) Applicant: Vertiv Corporation, Columbus, OH (US)

(72) Inventors: Kevin R. Ferguson, Dublin, OH (US); Philip R. Aldag, Columbus, OH (US); Michael Lukehart, Lewis Center, OH (US); Rodolfo Rosas, Austin, TX (US); Zachary Sadecki, Austin, TX (US)

(73) Assignee: Vertiv Corporation, Columbus, OH (US)

( * ) Notice: Subject to any disclaimer, the term of this patent is extended or adjusted under 35 U.S.C. 154(b) by 0 days.

(21) Appl. No.: 17/003,740

(22) Filed: Aug. 26, 2020

(65) Prior Publication Data

US 2021/0063453 A1 Mar. 4, 2021

Related U.S. Application Data

(60) Provisional application No. 62/892,221, filed on Aug. 27, 2019.

(51) Int. Cl.
*G01R 25/00* (2006.01)
*G01R 21/133* (2006.01)
(Continued)

(52) U.S. Cl.
CPC ......... *G01R 25/005* (2013.01); *G01R 21/133* (2013.01); *G06F 3/167* (2013.01);
(Continued)

(58) Field of Classification Search
CPC .... G01R 25/005; G01R 21/133; G01R 29/18; G01R 25/00; G01R 19/2513; G06F 3/167;
(Continued)

(56) References Cited

U.S. PATENT DOCUMENTS 8,305,737 B2   11/2012   Ewing et al.
9,088,376 B2   7/2015    Laulainen et al.
(Continued)

FOREIGN PATENT DOCUMENTS

EP   2802887 A1   11/2014

OTHER PUBLICATIONS

International Search Report and Written Opinion regarding International Application No. PCT/US2020/048170, dated Dec. 10, 2020.

*Primary Examiner* — Giovanni Astacio-Oquendo
(74) *Attorney, Agent, or Firm* — Harness, Dickey & Pierce, P.L.C.

(57) ABSTRACT

The present system relates to a power topology mapping system for identifying which one of one or more equipment components are being powered from a specific phase of a multi-phase AC power source. The system makes use of a plurality of power receiving subsystems which each receive an AC power signal from at least one phase of the multi-phase AC power source. Each power receiving subsystem has a communications card, an identification designation unique to it, and a controller. One of the power receiving subsystems is designated as a reference power domain component. The controllers each carry out phase angle measurements associated with the AC power signal being received by its power receiving subsystem. A topology mapping subsystem is included which analyzes phase angle measurement data reported by the power receiving subsystems and determines which subsystem is being powered by which phase of the multi-phase AC signal.

20 Claims, 6 Drawing Sheets

(51) Int. Cl.
*H02J 13/00* (2006.01)
*G06F 3/16* (2006.01)
*G10L 13/02* (2013.01)
*G10L 15/22* (2006.01)
*G11B 27/031* (2006.01)
*H04N 5/765* (2006.01)

(52) U.S. Cl.
CPC .............. *G10L 13/02* (2013.01); *G10L 15/22* (2013.01); *G11B 27/031* (2013.01); *H02J 13/00002* (2020.01); *H02J 13/00006* (2020.01); *H04N 5/765* (2013.01); *H02J 13/00036* (2020.01)

(58) Field of Classification Search
CPC ....... G10L 13/02; G10L 15/22; G11B 27/031; H04N 5/765; H02J 13/00002; H02J 13/00006; H02J 13/00036; H02J 9/062; H02J 2310/70; Y02B 90/20; Y04S 40/12; Y04S 20/12
See application file for complete search history.

(56) References Cited

U.S. PATENT DOCUMENTS

| | | | |
|---|---|---|---|
| 9,166,396 | B2 | 10/2015 | Billingsley et al. |
| 9,257,837 | B2 | 2/2016 | Chisenga et al. |
| 9,541,947 | B2 | 1/2017 | Yen et al. |
| 2011/0122798 | A1* | 5/2011 | Hughes ................ H04B 3/546 370/254 |
| 2013/0141075 | A1 | 6/2013 | Erhart et al. |
| 2013/0325376 | A1 | 12/2013 | Turicchi, Jr. et al. |
| 2014/0281649 | A1 | 9/2014 | Zajkowski |
| 2018/0254994 | A1 | 9/2018 | Dolezilek et al. |
| 2018/0287422 | A1* | 10/2018 | Seewald ................ H04L 41/20 |
| 2021/0257968 | A1* | 8/2021 | Mellor, Jr. ............. H04B 3/542 |

* cited by examiner

METHOD AND APPARATUS FOR PROVIDING AUTOMATED POWER TOPOLOGY MAPPING

CROSS-REFERENCE TO RELATED APPLICATIONS

This application claims the benefit of U.S. Provisional Application No. 62/892,221, filed on Aug. 27, 2019. The entire disclosure of the above application is incorporated herein by reference.

FIELD

The present disclosure relates to methods and systems for power mapping, and more particularly to systems and methods for automatically and dynamically defining power topology maps for power infrastructure devices, to enable unambiguous determinations of the power states of infrastructure devices without the traditional manual mapping efforts typically carried out by individuals.

BACKGROUND

The statements in this section merely provide background information related to the present disclosure and may not constitute prior art.

For current critical power environments such as data centers, insight into power distribution infrastructure directly impacts IT system uptime, and thus economics, for a wide variety of businesses.

Power distribution infrastructure is represented by Power Topology Maps ("PTMs"). PTMs define the electrical interconnection of critical power infrastructure IT devices; specifically, the position of infrastructure devices and IT devices on electrical branch circuits within a facility. The infrastructure and IT devices may be, for example and without limitation, computer room air conditioning units ("CRAC" units), uninterruptible power supplies ("UPSs"), power distribution units ("PDUs") of both the rack mounted and floor standing types, switchgear, serial consoles, and servers, as well as other computer and electrically powered support equipment, which all may be generically referred to as "loads". The facility may be, for example and without limitation, a building with one or more rooms, or even simply a single large room of a building or other defined area, or possibly even a collection of buildings.

The "position" of a given infrastructure device in a facility includes a designation of one or more phases and an association with a branch circuit, where the branch circuit may lead to other devices and loads. With traditional power delivery mapping schemes, the mapping is captured and maintained by IT professionals who manually trace and note the locations of all infrastructure devices receiving power from an AC power source. Mapping may be enhanced with electronic test aids or by indirect methods such as device identification through an IT network, but devices and loads must be manually traced by an individual per phase and branch circuit. For rack PDUs, the power service delivered through electrical cabling associated with branch circuits may pass through ceiling areas, through cable trays where a large plurality of other cables is clustered, and through areas beneath a floor of a data center, where access is limited. Furthermore, device identification through an IT network does not directly capture electrical branch relationships.

The power delivery mapping that has traditionally been conducted manually, on an ad hoc basis, can become invalid over time as changes are made at the AC electrical panel board and also at equipment racks in the facility. Since IT and infrastructure devices do not auto-discover their phase or branch circuit positions, mapping is typically done at initial set-up of a device, or as part of scheduled maintenance, or sometimes during emergency events, placing an additional burden on IT/facilities staff during critical power operations and events.

Although the operating state of each device is known because of monitoring software, manually performed mapping methods may result in PTM states that are uncertain or ambiguous because of human error or undocumented equipment changes. Thus a device's power consumption may be inaccurately associated with the power delivery equipment actually associated with another device. In general, manual PTM methods may lead to a lack of insight on managing and responding to real-time power operations and events. These limitations in current practice can result in a number of issues, including:

stranded power capacity due to inadequate information to capture full utilization of power infrastructure;

opportunity costs because of IT staff being forced to deal with power issues affecting IT and/or infrastructure devices, rather than managing usage of devices within a facility;

increased downtime risks due to electrical overload and associated device/load or system downtime or damage when adding or changing devices and/or loads;

additional time needed to resolve device and/or load failure or maintenance due to time required to confirm the current PTM;

lack of present knowledge of recently added or removed devices that end up affecting electrical system troubleshooting or performance;

limited operational vision; and narrow or corrupt analytics to direct infrastructure/maintenance direction.

Further, building management system (BMS) software cannot effectively aggregate power utilization along the power chain unless the voltage phasing is known.

Accordingly, there remains a strong need in the industry for a system that is able to create a PTM without the need for IT professionals to manually trace the connections of each and every device in a facility which is being powered from an AC power source, and which provides an easily updated and accurate means for indicating the association of every IT and infrastructure device being powered in a facility or designated environment, with its branch circuit.

SUMMARY

This section provides a general summary of the disclosure, and is not a comprehensive disclosure of its full scope or all of its features.

In one aspect the present disclosure relates to a power topology mapping system for identifying which one of one or more equipment components are being powered from a specific phase of a multi-phase AC power source. The system may comprise a plurality of power receiving subsystems each receiving an AC power signal from at least one phase of the multi-phase AC power source. Each one of the plurality of power receiving subsystems may include a communications card; an identification designation uniquely identifying the power receiving subsystem; and a controller. A topology mapping subsystem may be included for analyzing phase angle data to identify if a given one of the power receiving subsystems is receiving AC power from a given one of the phases of the multi-phase AC power source.

At least one of the plurality of power receiving subsystems is designated as a reference power domain component whose relationship to a specific one of the phases of the multi-phase AC power source is known, and wherein remaining ones of the plurality of power receiving components each have a relationship relative to the phases of the multi-phase AC power source which is unknown. The controller of each one of the remaining ones of the plurality of power receiving subsystems is configured to carry out a phase angle measurement of the received AC power signal at a predetermined time. The topology mapping subsystem is configured to use the phase angle measurements obtained by each one of the controllers, in connection with the identification designation assigned to each one of the remaining ones of the plurality of power receiving subsystems, to identify whether a given one of the remaining ones of the plurality of power receiving subsystems is being powered by a given one of the phases of the multi-phase AC power source.

In another aspect the present disclosure relates to a power topology mapping system for identifying which one of one or more equipment components are being powered from a specific phase of a multi-phase AC power source. The system may comprise a plurality of power receiving subsystems each receiving an AC power signal from at least one phase of the multi-phase AC power source. Each one of the plurality of power receiving subsystems may include a communications card, an identification designation uniquely identifying the power receiving subsystem, and a controller. A topology mapping subsystem may be included for analyzing phase angle data to identify if a given one of the power receiving subsystems is receiving AC power from a given one of the phases of the multi-phase AC power source. At least one of the plurality of power receiving subsystems is designated as a reference power domain component whose relationship to a specific one of the phases of the multi-phase AC power source is known, and remaining ones of the plurality of power receiving components each have a relationship relative to the phases of the multi-phase AC power source which is unknown. The controller of each one of the power receiving subsystems is configured to carry out a phase angle measurement of the received AC power signal at a plurality of designated times. The phase angle measurements are made in part by monitoring for a zero crossing of the received AC power signal at each one of the plurality of designated times. The communications card of each one of the remaining ones of the plurality of power receiving components is configured to report all of the phase angle measurements collected to the topology mapping subsystem. The topology mapping subsystem is configured to use the phase angle measurements obtained by each one of the controllers, in connection with the identification designation assigned to each one of the remaining ones of the plurality of power receiving subsystems, to identify which phase of the multi-phase AC power source is being used to power each one of the remaining ones of the plurality of power receiving subsystems.

In still another aspect the present disclosure relates to a method for power topology mapping to identify which one of one or more equipment components are being powered from a specific phase of a multi-phase AC power source. The method may comprise providing a plurality of power receiving subsystems, each receiving an AC power signal from at least one phase of the multi-phase AC power source. The method may further include assigning one of the plurality of power receiving subsystems as a reference power domain component. The method may further include assigning remaining ones of the plurality of power receiving subsystems unique identification designations, and using the remaining ones of the plurality of power receiving subsystems to each measure a phase angle of the AC power signal being received, at least at one predetermined time. The method may further include using the phase angle measurements together with the identification designations to identify which phase of the multi-phase AC power source is being used to power each one of the remaining ones of the plurality of power receiving subsystems.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way. In the following drawings.

DETAILED DESCRIPTION

Figure 1:
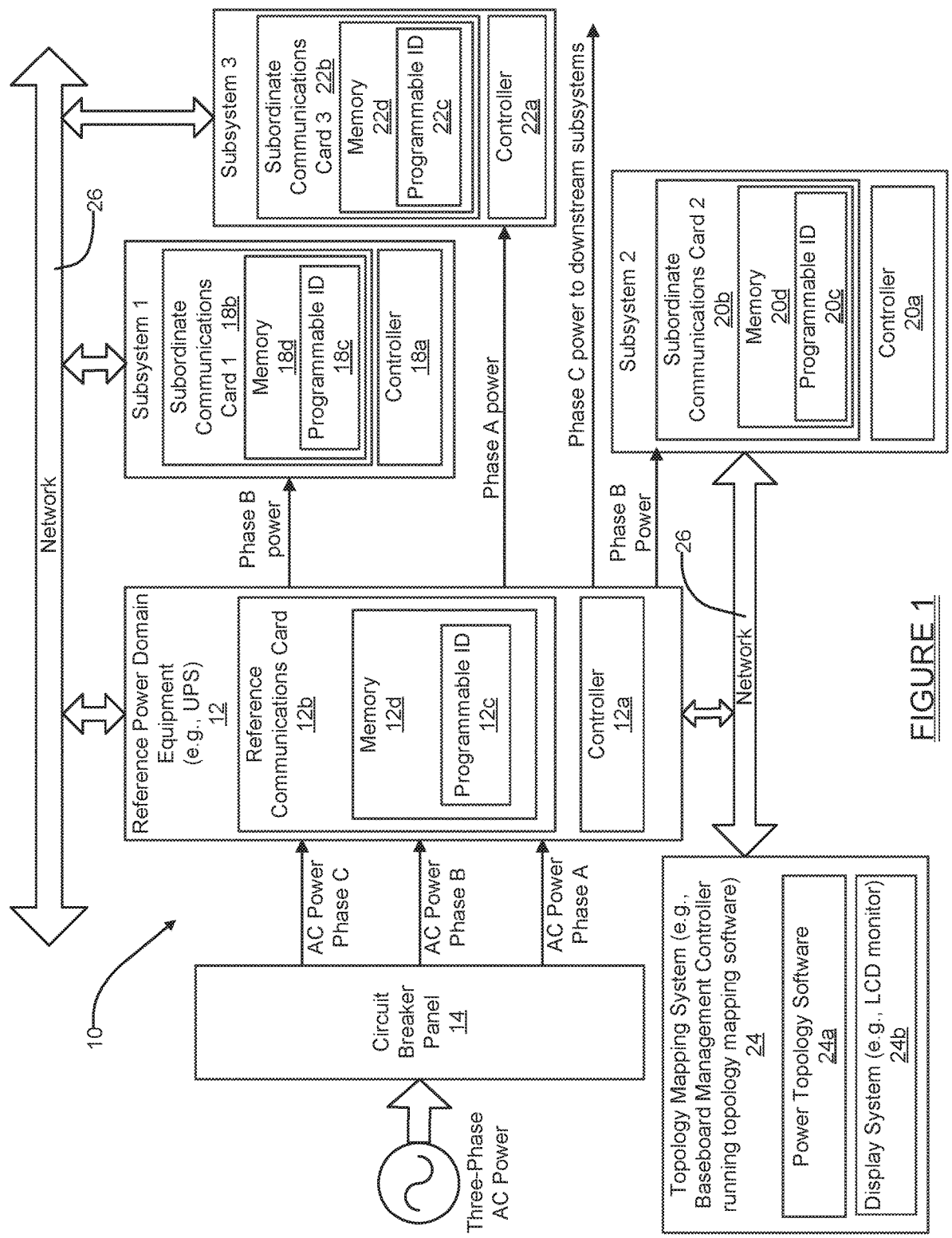
FIG. 1 is a high level block diagram of one example embodiment of a system in accordance with the present disclosure for identifying which ones of a plurality of subsystems are operably associated with a given power domain.

The following description is merely exemplary in nature and is not intended to limit the present disclosure, application, or uses. It should be understood that throughout the drawings, corresponding reference numerals indicate like or corresponding parts and features.

Referring to FIG. 1 there is shown one example of an automated power topology mapping system 10 in accordance with one embodiment of the present disclosure. For convenience the automated power topology mapping system 10 will be referred to throughout the following discussion simply as "the system 10". The system 10 may include a reference power domain component 12, which in this example is shown as an uninterruptible power supply, and which will hereafter be referred to as "UPS 12" merely for convenience. It will be appreciated immediately that the reference power domain equipment may be any other suitable component for distributing power to downstream subsystems, for example a busway, circuit breaker panel, floor PDU, or switchgear. Accordingly, the present disclosure is not limited to only use of the UPS 12 as the reference equipment component.

Referring further to FIG. 1, the UPS 12 may receive three phase AC power from a circuit breaker panel 14 or other power distribution subsystem. In this example, an internal bus (not shown) within the UPS 12 routes the phase A power to power downstream Subsystem 3, while a separate internal bus (not shown) routes phase B power to downstream Subsystems 1 and 2. Phase C power may be routed via another internal bus within the UPS 12 to one or more other downstream subsystems (not shown). Again, this is meant to be just one example as to how power from the three different AC power phases may be distributed among a plurality of downstream subsystems, and the present disclosure is not limited to any one specific power distribution scheme.

The UPS 12 in this example may include a controller 12a and a reference communications card 12b. The reference communications card 12b may include a programmable identification (ID) number or code 12c stored in a memory 12d thereof that uniquely identifies the UPS 12 as the reference power domain equipment. Subsystem 1 may similarly include a controller 18a and a subordinate communications card 18b, with the communications card having a programmable ID 18c stored in a non-volatile memory 18d that uniquely identifies Subsystem 1. Subsystem 2 likewise may include a controller 20a and a subordinate communications card 20b, with the communications card 20b having a programmable ID 20c stored in a non-volatile memory 20d that uniquely identifies Subsystem 2. Subsystem 3 similarly may include a controller 22a and a subordinate communications card 22b, with the subordinate communications card 22b having a programmable ID 22c stored in a non-volatile memory 22d which uniquely identifies Subsystem 3. In this example the term "subordinate", when used with reference to the communications card 18b, 20b or 22b, means that the communications card will be receiving some information from the UPS 12 and using that information to provide information back to the UPS 12 that can be used to identify if it is part of a specified power domain, for example part of the group of subsystems being powered from one specific AC phase of the UPS 12. So in this sense, the communications cards 18b, 20b and 22b can be thought of as being "subordinate" to the reference communications card 12b.

In the example of FIG. 1, the system 10 also may include a topology mapping system 24 which may include power topology mapping software 24a and optionally a display system 24b (e.g., LCD or LED display monitor). In one specific example the topology mapping system 24 may be run by a commercially available building management system ("BMS"), although any type of controller or processor which is able to run the topology mapping software and make mathematical calculations may potentially be used. The UPS 12 and the Subsystems 1, 2 and 3, along with the topology mapping system 24, are all in communication via a network 26. Accordingly, the communications cards 18b, 20b and 22b are able to receive information from the reference communications card 12b via the network 26 and to transmit information via the network 26 back to the topology mapping system 24.

The present disclosure presents two different methods for determining the power topology of the Subsystems 1, 2 and 3 using phase angle measurement methodology. In one method, phase angle measurements are synchronized to an absolute time source, and in the other, phase angle measurements are synchronized to a relative time source, triggered by the reference power domain equipment. The absolute time methodology will be described first with reference to FIGS. 2a, 2b and 3. It involves the communications cards 12b, 18b, 20b and 22b synchronizing their internal clocks using a suitable protocol, for example an IEEE 1488 Precision Time Protocol (PTP) down to a sub-millisecond range. This level of precision time clocking enables accurate absolute timing of phase measurements.

Figure 2A:
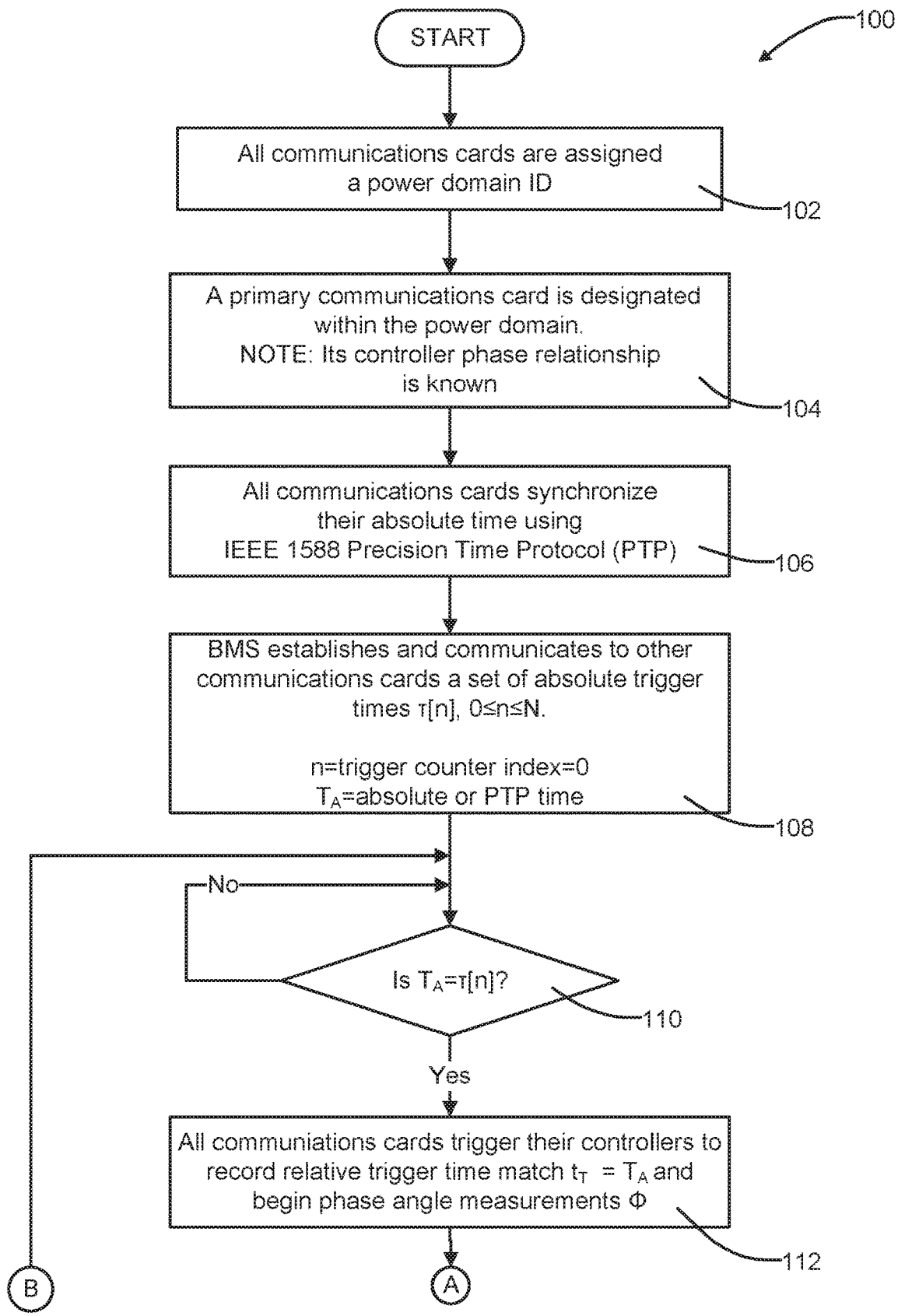
FIGS. 2a and 2b are a flowchart of one method that the system of FIG. 1 may use in carrying out various operations to identify which ones of the downstream subsystem are being powered from which phase, and from a given power domain, and wherein the method involves using phase angle measurements taken starting at an absolute reference time, to which communications cards in all of the subsystems are synchronized, and in which a plurality of phase measurements are taken by each downstream subsystem.
Figure 2B:
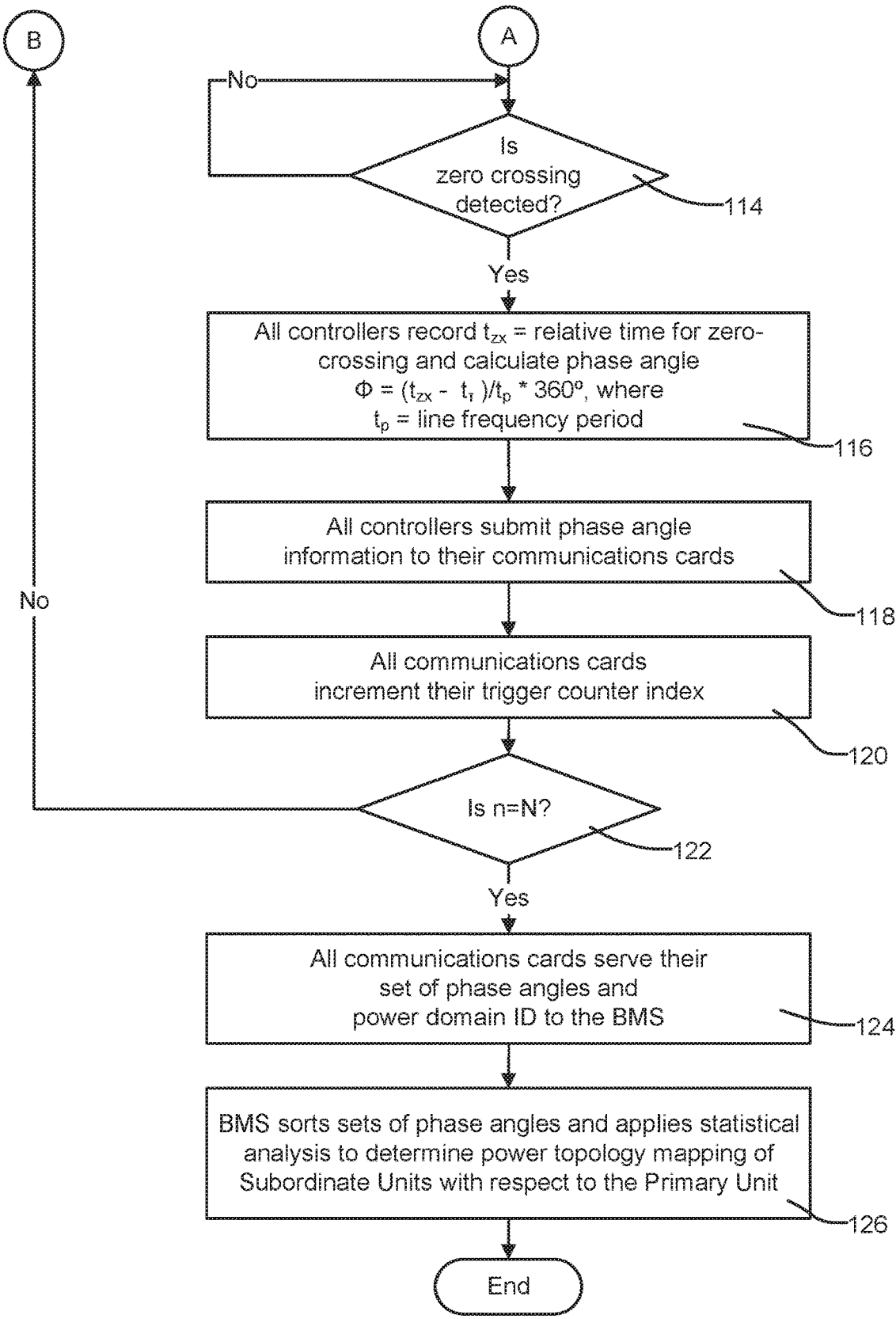

FIGS. 2a and 2b illustrate one example of a high level flowchart 100 showing various operations that may be used to carry out the phase angle analysis methodology. The operations that will be described in FIGS. 2a and 2b will be described with reference to Phase B of the three phase AC input source, with it being appreciated that the operations described in FIGS. 2a and 2b may be conducted for Phase A or Phase C, or for more than one phase. (Because of the consistent phase relationship of three-phase power, only one phase angle calculation would be required, and the others would be redundant.)

Initially at operation 102, the communications cards of all equipment may be assigned a programmable ID to identify their power domain. At operation 104, a primary communications card may be designated within the power domain in order to identify a specific piece of equipment as the primary or reference power equipment. In the example shown in FIG. 1, the UPS 12 forms the primary power equipment. At operation 106, the communications card of the UPS 12 (i.e., the reference power equipment) and the communications cards 18b, 20b and 22b of the downstream Subsystems 1, 2 and 3 synchronize their absolute time in accordance with the IEEE 1588 Precision Time Protocol mentioned above. This operation essentially synchronizes the clocks of the communications cards 18b, 20b, and 22b to the clock in the communications card 12b of the UPS 12.

At operation 108, the building management system (BMS) establishes a set of absolute trigger times T[n], $0 \leq n \leq N$, where n is the trigger counter index, and N is the maximum number of phase angle measurements to be taken. The trigger counter index n is initially set to 0. The number of phase angle measurements required may depend upon communication latencies, which may be influenced by higher priority tasks in progress and other factors; thus experimentation may be required to determine an appropriate average number of values. Also at operation 108, the BMS communicates the set of absolute trigger times to the communications cards of the downstream Subsystems 1, 2, and 3. At operation 110, each communications card compares the current (absolute) time $T_A$ to the time in the set of absolute trigger times T[n] indexed by the current value of the trigger counter. If the times match, the check at operation 110 returns a "Yes" answer, and operation 112 is then performed. If the check at operation 110 returns a "No" answer, operation 110 is repeated.

At operation 112, each communications card triggers its controller to record the time of the trigger match $t_T = T_A$ and initiate the phase angle measurement process. At operation 114, each controller checks its AC waveform for a zero crossing. If the zero crossing is detected, the check at operation 114 returns a "Yes" answer, and operation 116 is performed. If the check at operation 114 returns a "No" answer, the controller repeats operation 114. At operation 116, the controller records the time of the zero crossing $t_{ZX}$ and calculates the phase angle measurement Φ as follows:

$$\Phi = \frac{t_{ZX} - t_T}{t_P} * 360°,$$

where $t_p$ is the line frequency period. At operation 118, each controller submits its phase angle information to its communications card. At operation 120, each communications card increments its trigger counter index n. At operation 122, the communications card checks if the trigger counter index n equals the maximum number of phase angle measurements. If this check returns a "Yes" answer, operation 124 is performed. If the check at operation 122 returns a "No" answer, then operation 110 is repeated; in other words, operations 110-122 are repeated until the check at operation 122 indicates that N phase angle measurements have been collected.

At operation 124, each communications card serves its set of phase angles along with its associated programmable ID (i.e., either 12c, 18c, 20c or 22c) to the BMS. At operation 126, the BMS power topology software 24a then sorts and statistically analyzes (e.g., by computing averages) the phase angle measurements reported by the UPS 12 and each of the Subsystems 1, 2, and 3, and then compares the results of the analyses of each of the Subsystems against the results for the UPS 12, and if the difference is very minor (e.g., within for example 10%), it determines that a match exists. If a match exists, the Subsystem under consideration is determined (or verified) to be associated with a given phase, and also within a given power domain of components being powered by the UPS 12.

It will be appreciated that the operations outlined in flowchart 100 enable the UPS 12 to produce a "reference" or "benchmark" phase angle measurement, against which the phase angle measurements reported by each of the Subsystems 1, 2 and 3 will be compared. To this end, operations 110-122 are essentially repeated by each of the Subsystems 1, 2 and 3, so that the UPS 12 and the Subsystems 1, 2 and 3 are all taking N separate phase angle measurements at the precisely the same times (i.e., N distinct times over several line cycles of the phase being measured). This sequence provides each of the Subsystems 1, 2 and 3 with N distinct phase measurements. The BMS then statistically analyzes the N collected phase measurements from each Subsystem 1, 2 and 3, for example, by calculating an average (i.e., mathematical mean) phase angle measurement.

Figure 3:
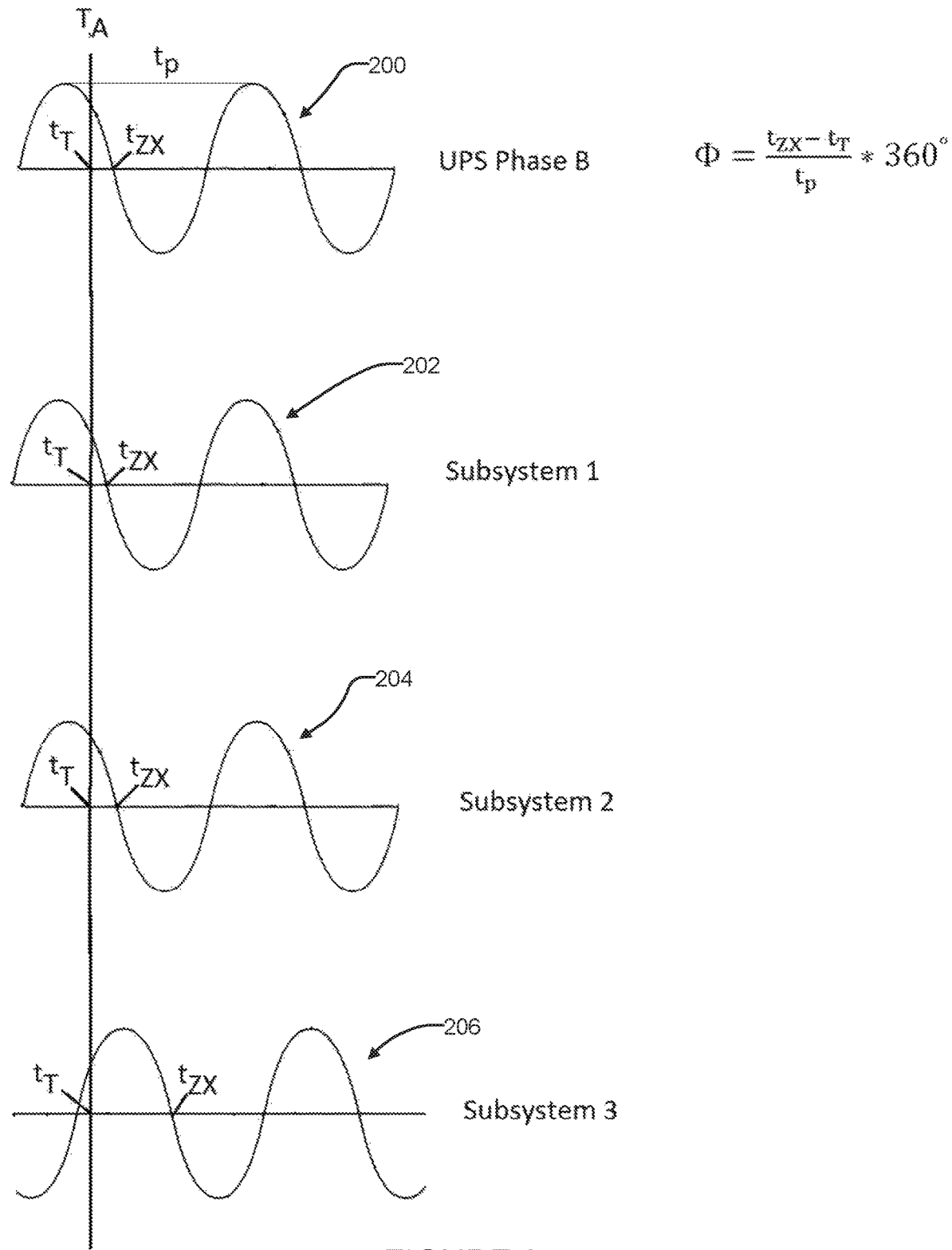
FIG. 3 is a series of waveforms illustrating how different ones of downstream subsystems being powered from the reference power domain equipment system take phase measurements relative to the reference time, and how the phase measurements may differ slightly at each downstream subsystem.

With brief reference to FIG. 3, examples of the AC waveforms measured by the UPS 12 (waveform 200), the Subsystem 1 (waveform 202), the Subsystem 2 (waveform 204), and the Subsystem 3 (waveform 206) are shown to illustrate the first phase angle measurement taken by each of UPS 12, Subsystem 1, Subsystem 2, and Subsystem 3. As noted above, in this example Phase B is being measured and Subsystems 1 and 2 are both being powered by Phase B of the three phase AC source, although that fact will not be known for certain until the method set forth in FIG. 2 is fully completed. The phase angle measurements measured by each of the UPS 12 and the Subsystems 1, 2 and 3 in this example begin at absolute reference time $T_A$.

From the waveforms 200, 202, 204 and 206 shown in FIG. 3, it can be seen that the precise phase measurements obtained at each measurement time will typically vary only slightly at each measurement time for the UPS 12 and for Subsystems 1 and 2, which are all being powered by Phase B. As shown in waveforms 202 and 204, the phase angle measurements for Subsystems 1 and 2 are taken at phase angles which vary only by small numbers of degrees, respectively, from the first measured phase angle of waveform 200. The phase measurements reported by Subsystem 3 are offset by 120 degrees from Phase B, since Subsystem 3 is being powered by Phase A in FIG. 1; thus its reported average phase angle measurement will differ significantly from those reported by Subsystems 1 and 2.

The process described above can be used to quickly and reliably determine which downstream Subsystems are associated with a given power domain and with what specific phase (A, B, or C) of the AC power being supplied by the UPS 12. This operation may be performed periodically as needed by the UPS 12 and the Subsystems 1, 2 and 3, for example weekly or monthly, or as otherwise deemed necessary by IT maintenance personnel.

Figure 4A:
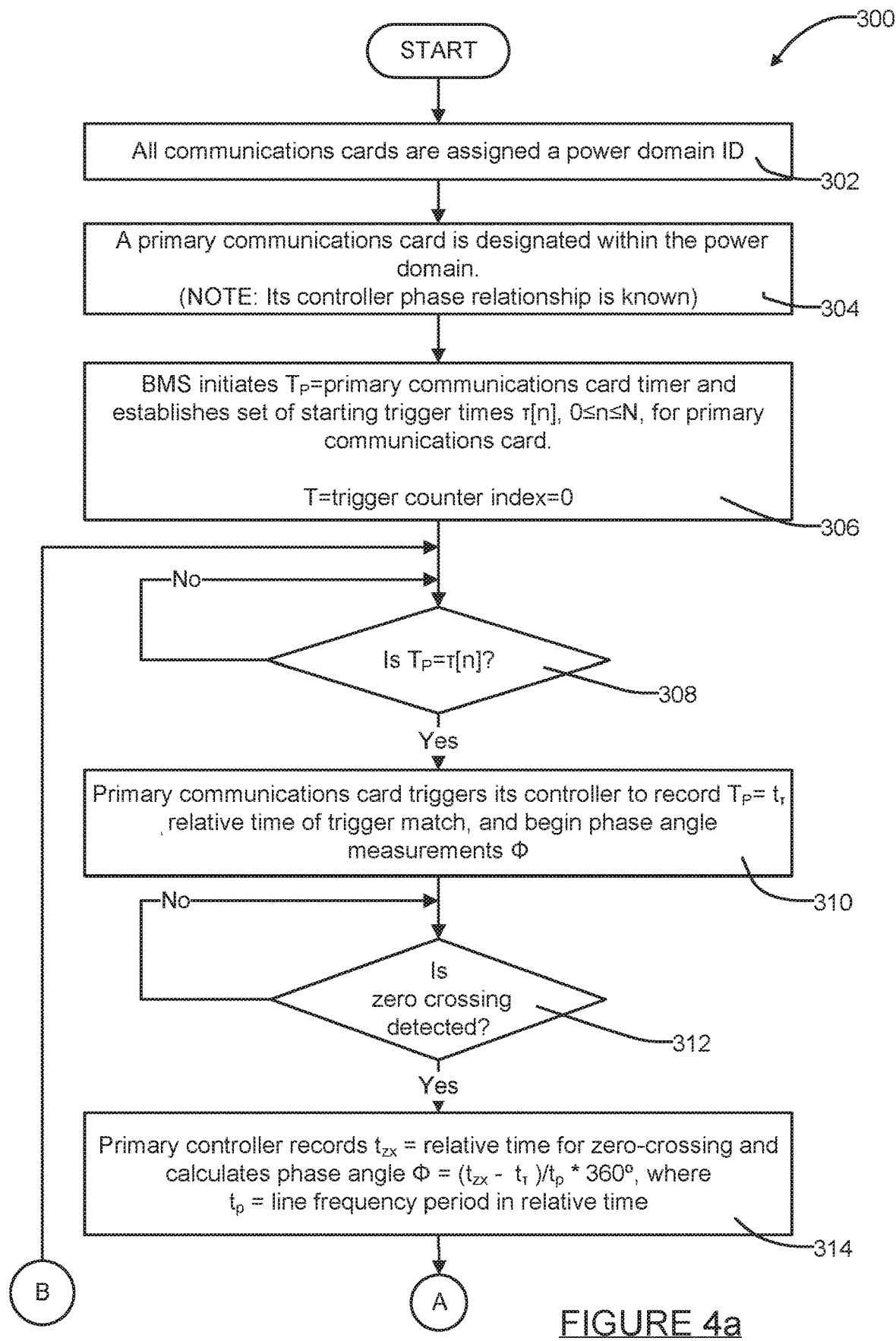
FIGS. 4a and 4b are a flowchart of another method that the system of FIG. 1 may use to identify which ones of the downstream subsystems are being powered from which AC power phase, but which instead relies on a real-time network message generated and broadcast by the reference power domain equipment after it synchronizes with the zero crossing of its first phase waveform, which the downstream subsystems use to trigger phase angle measurements that may be compared with those of the reference power domain equipment.
Figure 4B:
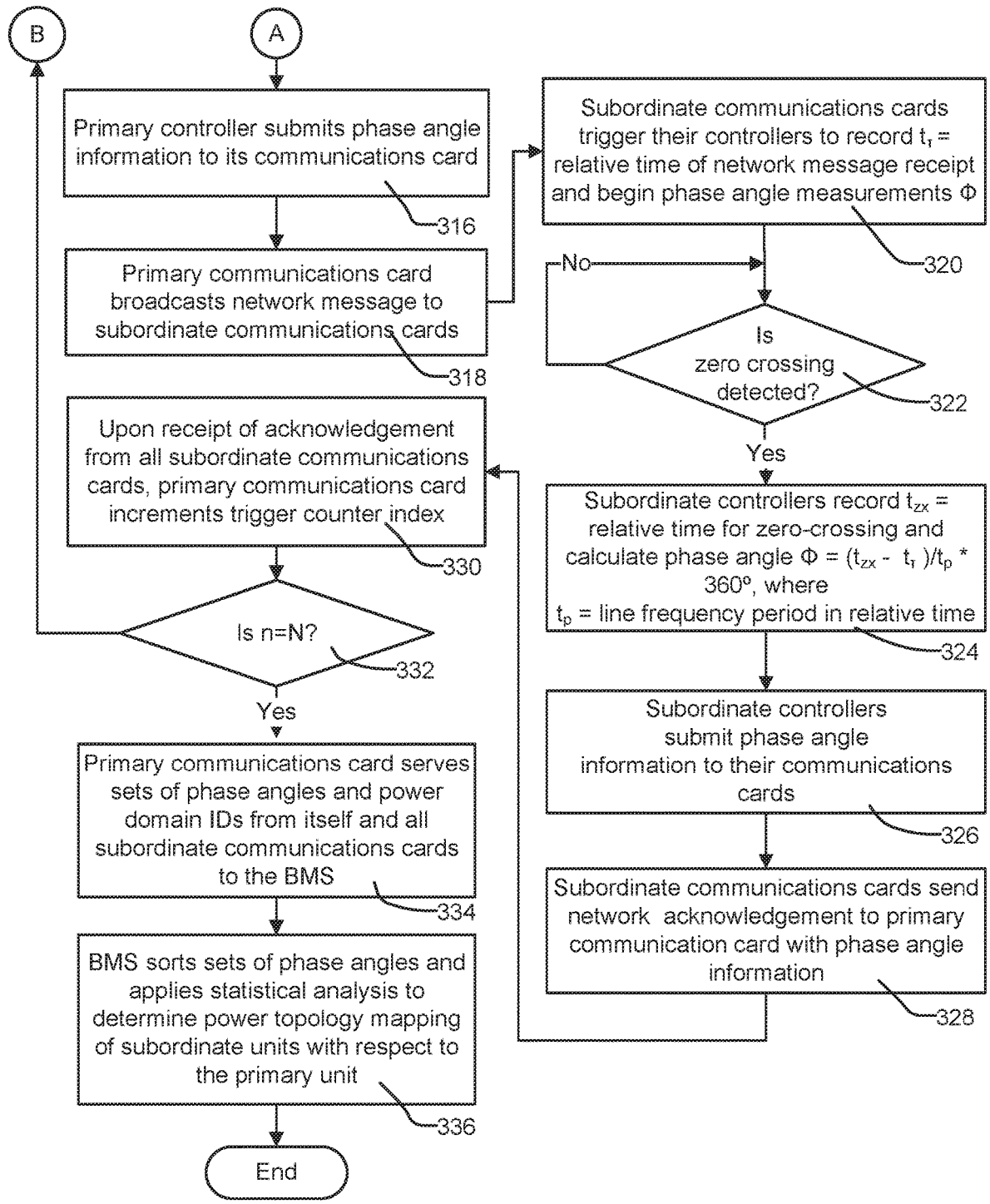

Referring now to FIGS. 4a and 4b, a high level flowchart 300 shows various operations that may be used to carry out an alternative method for determining power mapping which relies on a real-time network message generated and broadcast by the reference power domain equipment after it synchronizes with the zero crossing of its first phase waveform. The message is used by the downstream subsystems to trigger phase angle measurements that may be compared with those of the reference power domain equipment. The operations that will be described in FIGS. 4a and 4b will be described with reference to one phase (e.g., Phase B) of the three phase AC input source, although the operations described in FIGS. 4a and 4b may be conducted for other phases (e.g., Phase A or Phase C), or for more than one phase. As already noted, only one phase angle calculation would be required because of the consistent phase relationship of three-phase power.

Initially at operation 302, the communications cards of all equipment may be assigned a programmable ID to identify their power domain. At operation 304, a primary communications card may be designated within the power domain in order to identify a specific piece of equipment as the primary or reference power equipment. In the example shown in FIG. 1, the UPS 12 forms the reference power equipment, and reference communications card 12b is the "primary communications card", and controller 12a the "primary controller", in this example. At operation 306, the building management system (BMS) initiates a primary communications card timer $T_P$ and establishes a set of starting trigger times T[n], 0≤n≤N, where n is the trigger counter index, and N is the maximum number of phase angle measurements to be taken. Experimentation may be required to determine an appropriate number of phase angle measurements N, which may be influenced by higher priority tasks in progress and other factors. The trigger counter index n is initially set to 0.

At operation 308, the primary communications card compares the current value of its timer $T_P$ to the time in the set of starting trigger times T[n] indexed by the current value of the trigger counter. If the times match, the check at operation 308 returns a "Yes" answer, and operation 310 is then performed. If the check at operation 308 returns a "No" answer, operation 308 is repeated.

At operation 310, the primary communications card triggers its controller to record the time $t_T$ of the trigger match and to initiate the phase angle measurement process. At operation 312, the primary communications card controller checks its AC waveform for a zero crossing. If the zero crossing is detected, the check at operation 312 returns a "Yes" answer, and operation 314 is performed. If the check at operation 312 returns a "No" answer, the controller repeats operation 312.

At operation 314, the primary controller records the time of the zero crossing $t_{ZX}$ and calculates the phase angle measurement Φ as follows:

$$\Phi = \frac{t_{ZX} - t_T}{t_p} * 360°,$$

where $t_p$ is the line frequency period.

At operation 316, the primary controller submits its phase angle information to its communications card. At operation 318, the primary communications card broadcasts a network message to the subordinate communications cards; in the example of FIG. 1, the subordinate communications cards are those of Subsystems 1, 2, and 3. At operation 320, each of the subordinate communications cards triggers its controller to record the relative time $t_T$ at which it received the network message receipt and to begin phase angle measurements.

At operation 322, each subordinate controller checks its AC waveform for a zero crossing. If the zero crossing is detected, the check at operation 322 returns a "Yes" answer, and operation 324 is performed. If the check at operation 322 returns a "No" answer, each subordinate controller repeats operation 322. At operation 324, each subordinate controller records the time of the zero crossing $t_{ZX}$ and calculates the phase angle measurement Φ as follows:

$$\Phi = \frac{t_{ZX} - t_T}{t_p} * 360°,$$

where $t_p$ is the line frequency period. At operation 326, each subordinate controller submits its phase angle information to its communications card. At operation 328, each subordinate communications card sends to the primary communications card a network acknowledgement that includes its phase angle information. When the primary communications card has received network acknowledgements from all subordinate communications cards, at operation 330, the primary communications card increments the trigger counter index. At operation 332, the communications card checks if the trigger counter index n equals the maximum number of phase angle measurements. If this check returns a "Yes" answer, operation 334 is performed. If the check at operation 332 returns a "No" answer, then operation 308 is repeated; in other words, operations 308-332 are repeated until the check at operation 332 indicates that N phase angle measurements have been collected.

At operation 334, the primary communications card serves the sets of phase angle measurements and power domain IDs from itself and all subordinate communications cards to the BMS. At operation 336, the BMS power topology software 24a then sorts and statistically analyzes (e.g., by computing averages) the phase angle measurements, and then compares the results of the analysis for each of the subordinate communications cards (e.g., Subsystems 1, 2, and 3) against the results for the primary communications card (e.g., the UPS 12), and if the difference is very minor (e.g., within possibly 10%), it determines that a match exists. If a match exists, the Subsystem under consideration is determined (or verified) to be associated with a given phase, and also within a given power domain of components being powered by the UPS 12.

It will be appreciated that the phase angle relationships may take longer to resolve with the operations described in flowchart 300 (FIGS. 4a and 4b) than with those described in flowchart 100 (FIGS. 2a and 2b) because of network latencies.

Examples of real-time network protocols that may be used in implementing each of the phase measurement and relative timestamping methodologies described above may include, without limitation, one or more of UDP, QUIC, Aeron and ICCP, or other suitable protocols. QUIC (Quick UPD Internet Connections) is a protocol designed to provide security protections equivalent to TLS/SSL, reduced connection and transport latency, and bandwidth estimation in each direction to avoid congestion. Aeron is a high-throughput and low-latency communications protocol for unicast and multicast servers transmissions. Aeron provides reliable multicast operation for modest receiver set size (<100 receivers), and multiple streams that can provide different quality of service. ICCP (Inter-Control Center Communications Protocol (also known as IEC 60870-6/TASE.2) is used by power utilities world-wide and provides real time data exchange for periodic system and time series data. ICCP enables real-time exchange of data for device status, measurements, timestamps, change of value counter, protection events, and other information affecting device operation.

The present disclosure thus provides a plurality of methods, as well as various embodiments of systems, that enable power topology mapping to be carried out in an automated fashion, and without requiring an individual to manually trace numerous electrical cables throughout a data center to reliably identify which subsystems are being powered by which phase of a reference equipment component (e.g., designated UPS). The methods described herein can be performed at any desired time interval (e.g., weekly, one per month, etc.) or if needed after equipment changes are made in a data center. The ability to quickly and reliably determine which ones of various subsystems in a data center are being powered from specific UPSs, and on which phases of an AC power source, in an automated fashion, is expected to be significantly ease the burden on data center workers in maintaining an up to date and accurate power topology map for a data center.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A power topology mapping system for identifying which one of one or more equipment components are being powered from a specific phase of a multi-phase AC power source, the system comprising:
   a plurality of power receiving subsystems each receiving an AC power signal from at least one phase of the multi-phase AC power source, each one of said plurality of power receiving subsystems including:
   a communications card;
   an identification designation uniquely identifying the power receiving subsystem;
   a controller;
   a topology mapping subsystem for analyzing phase angle data to identify if a given one of the power receiving subsystems is receiving AC power from a given one of the phases of the multi-phase AC power source;
   at least one of the plurality of power receiving subsystems being designated as a reference power domain component whose relationship to a specific one of the phases of the multi-phase AC power source is known, and wherein remaining ones of the plurality of power receiving subsystems each have a relationship relative to the phases of the multi-phase AC power source which is unknown;

the controller of each one of the remaining ones of the plurality of power receiving subsystems being configured to carry out a phase angle measurement of the received AC power signal at a predetermined time; and the topology mapping subsystem using the phase angle measurements obtained by each one of the controllers, in connection with the identification designation assigned to each one of the remaining ones of the plurality of power receiving subsystems, to identify whether a given one of the remaining ones of the plurality of power receiving subsystems is being powered by a given one of the phases of the multi-phase AC power source.

2. The system of claim 1, wherein the reference power domain component is configured to provide the predetermined time to each one of the controllers of the remaining ones of the plurality of power receiving subsystems so that the phase angle measurements are synchronized to an absolute time source.

3. The system of claim 1, wherein the reference power domain component is configured to provide a plurality of predetermined times to the controllers at which the phase angle measurements are to be made by the controllers of each one of the remaining ones of the plurality of power receiving subsystems.

4. The system of claim 3, wherein the plurality of predetermined times is provided simultaneously to remaining ones of the plurality of power receiving subsystems, which are then used by each one of the remaining ones of the plurality of power receiving subsystems in independently obtaining phase angle measurements at each one of the plurality of predetermined times, and which are then reported by each one of the remaining plurality of power receiving subsystems to the topology mapping subsystem; and wherein the topology mapping subsystem is configured to use the phase angle measurements received from the plurality of power receiving subsystems, together with the identification designations of each one of the remaining ones of the power receiving subsystems, to identify which phase of the multi-phase AC power source is powering each one of the remaining ones of the plurality of power receiving subsystems.

5. The system of claim 1, wherein each one of the remaining ones of the plurality of power receiving subsystems includes a communications card for communicating its associated obtained phase angle measurements to the topology mapping subsystem.

6. The system of claim 1, wherein the reference power domain component includes a communications card, and wherein each one of the remaining ones of the plurality of power receiving subsystems includes a communications card for bidirectionally communicating with the controller of the reference power domain component.

7. The system of claim 1, wherein each said one of the plurality of power receiving subsystems further includes a memory, and the identification designation is a programmable designation programmed into the memory.

8. The system of claim 1, wherein each one of the power receiving subsystems includes a communications card, and wherein all of the communications cards synchronize to an absolute time using a predetermined time protocol prior to taking the phase angle measurement.

9. The system of claim 8, wherein each one of the plurality of power receiving subsystems includes a communications card, and wherein the communications card of the reference power domain component is configured to transmit an instruction to each one of the communications cards of the remaining ones of the plurality of power receiving subsystems commanding each one of the remaining ones of the plurality of power receiving subsystems to begin taking phase angle measurements.

10. The system of claim 1, wherein each one of the plurality of power receiving subsystems monitors a time at which a zero crossing of an AC power signal being received occurs, and uses the zero crossing time to help calculate the phase angle measurement.

11. The system of claim 10, wherein the controller records the time of the zero crossing $t_{ZX}$ and calculates the phase angle measurement $\Phi$ using a formula:

$$\Phi = \frac{t_{ZX} - t_T}{t_p} * 360°,$$

where $t_p$ is the line frequency period, $t_{ZX}$ is the time recorded when a zero crossing occurs, and $t_T$ is a trigger match time which equals an absolute trigger time at which a phase angle measurement is to be taken.

12. The system of claim 1, wherein the topology mapping subsystem is configured to use the phase angle measurements reported by each one of the remaining ones of the power receiving subsystems, with the identification designation of each one of the remaining ones of the power receiving subsystems, to identify a specific phase of the multi-phase AC power signal that is powering each one of the remaining ones of the plurality of power receiving subsystems.

13. A power topology mapping system for identifying which one of one or more equipment components are being powered from a specific phase of a multi-phase AC power source, the system comprising:

a plurality of power receiving subsystems each receiving an AC power signal from at least one phase of the multi-phase AC power source, each one of said plurality of power receiving subsystems including:

a communications card;

an identification designation uniquely identifying the power receiving subsystem;

a controller;

a topology mapping subsystem for analyzing phase angle data to identify if a given one of the power receiving subsystems is receiving AC power from a given one of the phases of the multi-phase AC power source;

at least one of the plurality of power receiving subsystems being designated as a reference power domain component whose relationship to a specific one of the phases of the multi-phase AC power source is known, and remaining ones of the plurality of power receiving subsystems has a relationship relative to the phases of the multi-phase AC power source which is unknown;

the controller of each one of said plurality of power receiving subsystems being configured to carry out a phase angle measurement of the received AC power signal at a plurality of designated times, wherein the phase angle measurements are made in part by monitoring for a zero crossing of the received AC power signal at each one of the plurality of designated times;

the communications card of each one of said remaining ones of the plurality of power receiving subsystems being configured to report all of the phase angle measurements collected to the topology mapping subsystem; and the topology mapping subsystem using the phase angle measurements obtained by each one of the controllers, in connection with the identification designation assigned to each one of the remaining ones of the plurality of power receiving subsystems, to identify which phase of the multi-phase AC power source is being used to power each one of the remaining ones of the plurality of power receiving subsystems.

14. The system of claim 13, wherein the reference power domain component is configured to transmit an instruction to each one of the remaining ones of the plurality of power receiving subsystems to begin collecting phase angle measurements.

15. The system of claim 14, wherein the reference power domain component is further configured to transmit information pertaining to a number of phase measurements to be taken, along with the instruction informing each one of the remaining ones of the plurality of power receiving subsystems to begin collecting phase angle measurements.

16. The system of claim 13, wherein the communications card of the reference power domain component is configured to transmit a series of times to each one of the remaining ones of the plurality of power receiving subsystems at which phase angle measurements are to commence and be carried out.

17. The system of claim 13, wherein the controller of each one of the power receiving subsystems records the time of the zero crossing $t_{ZX}$ and calculates the phase angle measurement $\Phi$ using a formula:

$$\Phi = t_{ZX} - t_T / t_p * 360°,$$

where $t_p$ is a line frequency period, $t_{ZX}$=time recorded when a zero crossing occurs, and $t_T$ is a trigger match time which equals an absolute trigger time at which a phase angle measurement is to be taken.

18. A method for power topology mapping to identify which one of one or more equipment components are being powered from a specific phase of a multi-phase AC power source, the method comprising:

providing a plurality of power receiving subsystems each receiving an AC power signal from at least one phase of the multi-phase AC power source;

assigning one of the plurality of power receiving subsystems as a reference power domain component;

assigning remaining ones of the plurality of power receiving subsystems unique identification designations;

using the remaining ones of the power receiving subsystems to each measure a phase angle of the AC power signal being received, at least at one predetermined time; and using the phase angle measurements together with the identification designations to identify which phase of the multi-phase AC power source is being used to power each one of the remaining ones of the power receiving subsystems.

19. The method of claim 18, wherein the reference power domain component transmits a plurality of designated phase angle measurement times to each of the remaining ones of the plurality of power receiving subsystems.

20. The method of claim 18, wherein the reference power domain component transmits a first instruction to command each one of said remaining ones of said plurality of power receiving subsystems to begin obtaining phase angle measurements; and after a time interval, the reference power domain component transmits a second instruction to command each one of said remaining ones of said plurality of power receiving subsystems to obtain additional phase angle measurements.

* * * * *